(12) United States Patent  
Ide et al.

(10) Patent No.: US 7,948,053 B2  
(45) Date of Patent: May 24, 2011

(54) SEMICONDUCTOR DEVICE AND METHOD OF FABRICATING THE SAME

(75) Inventors: Yugo Ide, Yokkaichi (JP); Minori Kajimoto, Yokkaichi (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/423,914

(22) Filed: Apr. 15, 2009

(65) Prior Publication Data

US 2009/0267177 A1    Oct. 29, 2009

(30) Foreign Application Priority Data

Apr. 25, 2008    (JP) .................................. 2008-115359

(51) Int. Cl.
   *H01L 29/00*    (2006.01)
(52) U.S. Cl. ................. 257/516; 257/536; 257/E27.016
(58) Field of Classification Search .................. 257/536, 257/532, 538, 314, 315, 316, 321, 311, 516, 257/E27.016
   See application file for complete search history.

(56) References Cited

U.S. PATENT DOCUMENTS

| 6,781,193 B2* | 8/2004 | Lee et al. ....................... 257/326 |
| 7,358,135 B2* | 4/2008 | Park .............................. 438/257 |
| 2006/0033151 A1 | 2/2006 | Shirota et al. |
| 2007/0267685 A1 | 11/2007 | Ishibashi |

FOREIGN PATENT DOCUMENTS

JP    2006-294649    10/2006

* cited by examiner

*Primary Examiner* — Victor Mandala  
*Assistant Examiner* — Scott Stowe  
(74) *Attorney, Agent, or Firm* — Oblon, Spivak, McClelland, Maier & Neustadt, L.L.P.

(57) ABSTRACT

A semiconductor device includes a first insulating film, paired resistance elements each of which includes a first conductive film formed on the first insulating film, a second insulating film formed on the first conductive film and a second conductive film formed on the second insulating film, paired first contact plugs formed on one of the resistance elements and arranged along a first direction, and paired second contact plugs formed on the other resistance. One of the resistance elements has a first width in a second direction perpendicular to the first direction, and a semiconductor region surrounded by an element isolation region has a second width. The first width is smaller than half of the second width. The second insulating films are spaced from each other by a first distance. The second conductive films are spaced from each other by a second distance. The second distance is longer than the first distance.

9 Claims, 13 Drawing Sheets

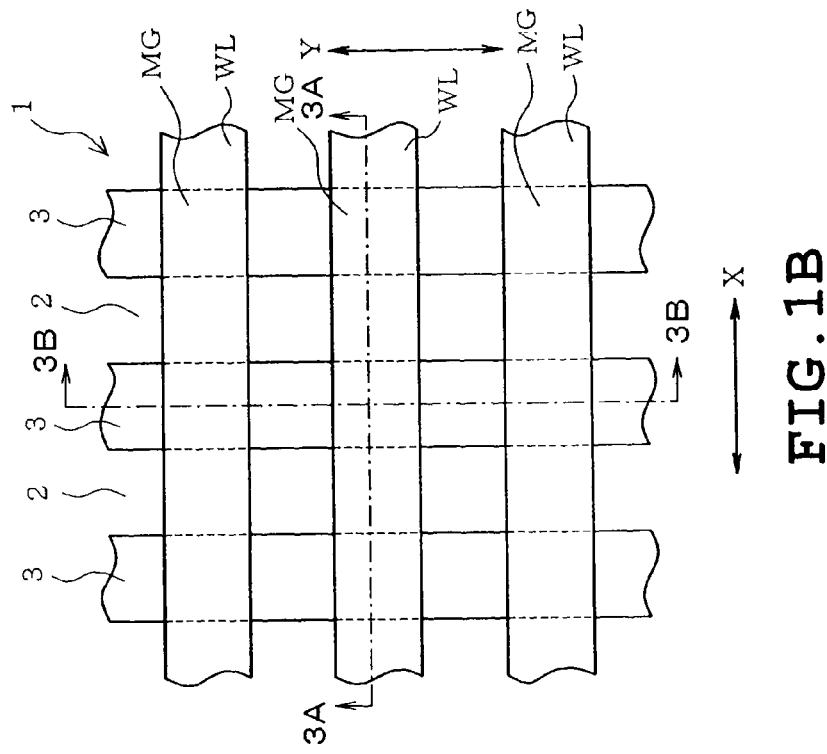
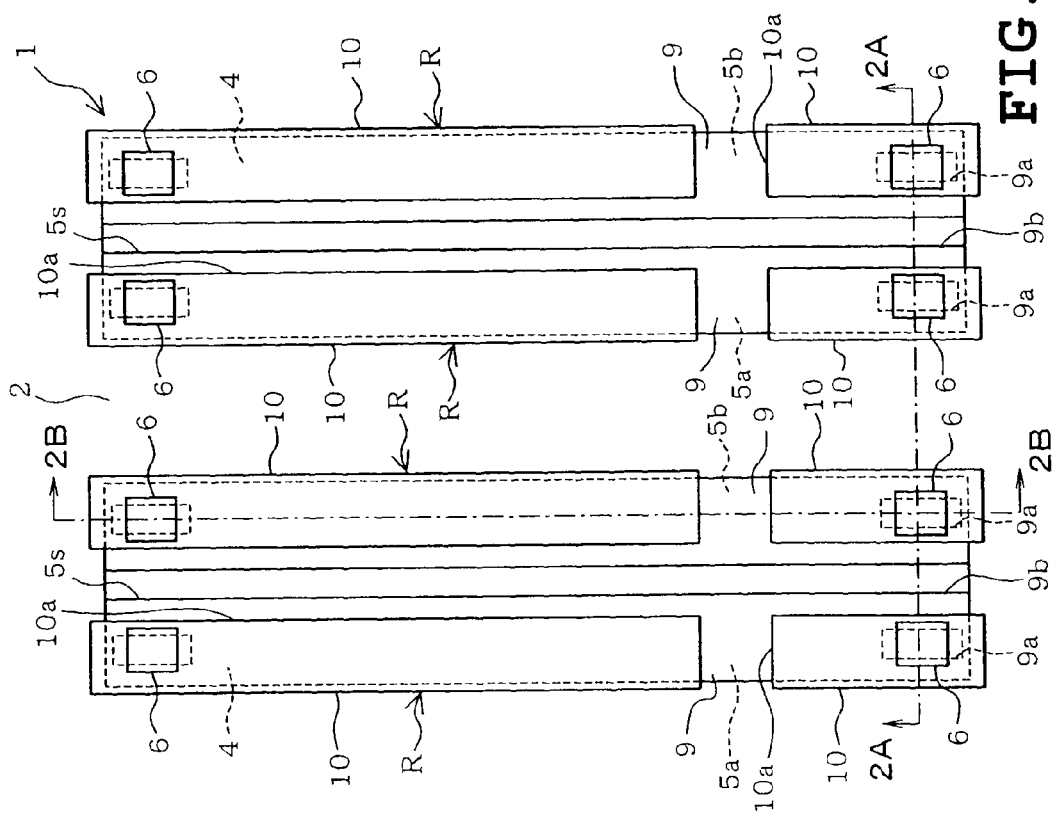

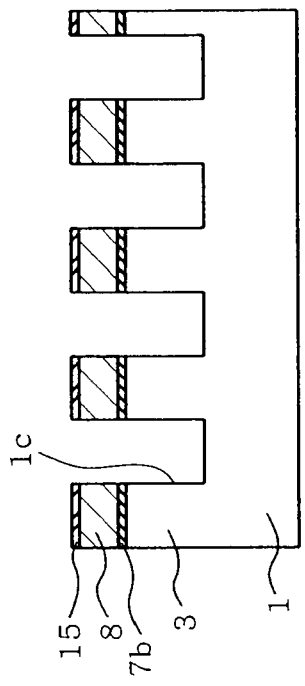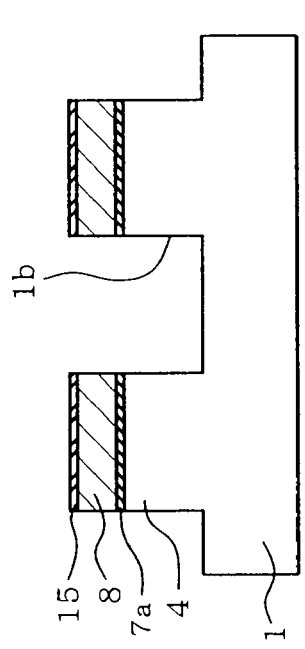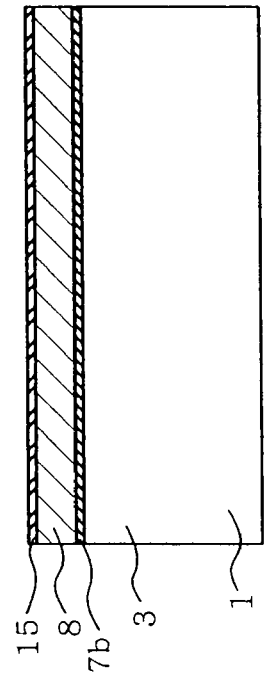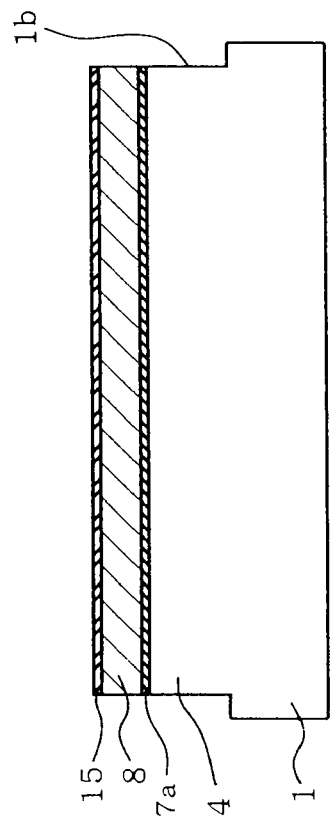
FIG. 5A
FIG. 5B
FIG. 5C
FIG. 5D

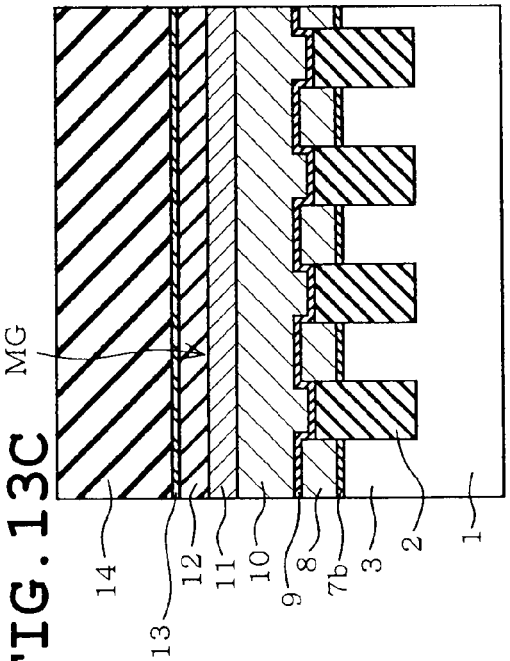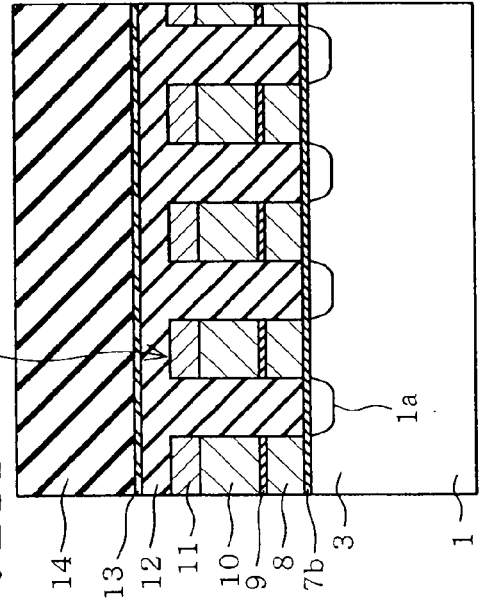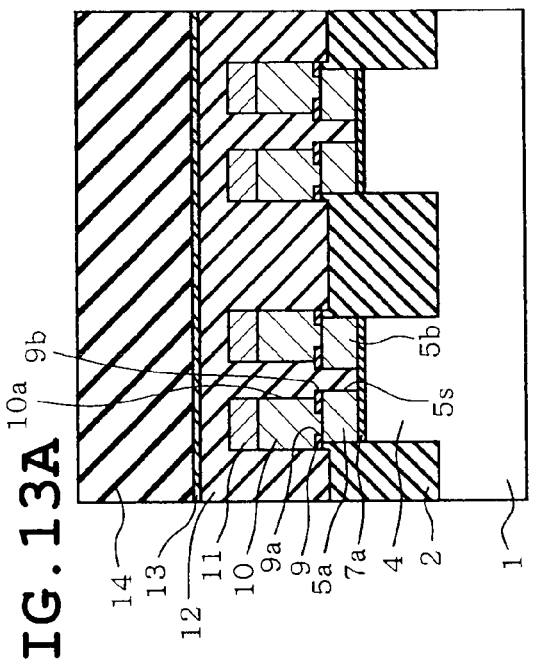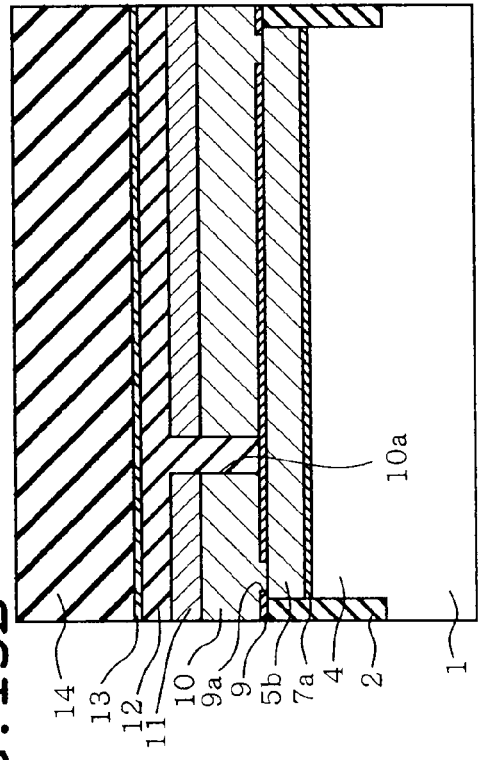

SEMICONDUCTOR DEVICE AND METHOD OF FABRICATING THE SAME

CROSS-REFERENCE TO RELATED APPLICATIONS

This application is based on and claims the benefit of priority from the prior Japanese Patent Application No. 2008-115359, filed on Apr. 25, 2008, the entire contents of which are incorporated herein by reference.

BACKGROUND OF THE INVENTION

1. Field of the Invention

The present invention relates to a semiconductor device which is configured so as to be provided with a resistance element by the use of a conductor layer, and a method of fabricating the same.

2. Description of the Related Art

Japanese patent application publication JP-A-2006-294649 discloses one of the nonvolatile semiconductor storage devices of the above-described type, for example. In the disclosed storage device, a resistance element is provided in a nonvolatile semiconductor storage device having floating gate electrodes, such as a NAND flash memory or a NOR flash memory. In forming the resistance element, a conductor layer for forming floating gate electrodes is formed on a gate insulating film into an elongate resistor. An opening is formed in an intergate insulating film formed on an upper surface of the resistor. A conductor layer is provided for forming control gate electrodes to be formed on an upper portion of the resistor. The conductor layer is divided in the lengthwise direction so that divided conductor layers serve as terminals provided on both ends of the resistor.

When the resistance element is to be set at a higher resistance value in the above-described configuration, a resistivity of the conductor layer for the forming of the floating gate electrodes serving as the resistor is increased, a film thickness or width of the conductor layer as a physical dimension is reduced, or a length of the conductor layer is increased. Since the conductor layer is provided as floating gate electrodes of memory cell transistors, increasing the resistivity or reducing the film thickness is accompanied by changes in the process design. The change in the process design affects the design of memory cell transistors. As a result, it is difficult to design individual transistors so that the transistors achieve respective desired characteristics. Furthermore, it is difficult to employ a method of increasing a resistance value by increasing the length of the conductor layer in the resistor by changes in a layout pattern since the method leads to an increase in an element area.

In view of the above-described problem, reducing the width is desirable as a means that is unaccompanied by an increase in a pattern area or any changes in the process design. In this case, a pattern width of the semiconductor needs to be reduced. However, differing from the memory cell region in which a repeated pattern is formed, a peripheral circuit region in which the resistance element is formed has a minimum width for the patterning by the photolithography process, which minimum width cannot be reduced to such a small value as in the memory cell region.

BRIEF SUMMARY OF THE INVENTION

According to one aspect of the present invention, there is provided a semiconductor device comprising a semiconductor substrate including a semiconductor region surrounded by an element isolation region; a first insulating film formed on the semiconductor region; a pair of resistance elements located at the semiconductor region, each of the resistance elements including a first conductive film formed on the first insulating film, a second insulating film formed on the first conductive film and a second conductive film formed on the second insulating film; a pair of first contact plugs formed on one of the resistance elements, the first contact plugs being arranged along a first direction relative to the semiconductor region; and a pair of second contact plugs formed on the other of the resistance elements, the second contact plugs being arranged along the first direction, wherein one of the resistance elements has a first width in a second direction which is perpendicular to the first direction, and the semiconductor region has a second width in the second direction, the first width being smaller than half of the second width; the second insulating films of the resistance elements are spaced from each other by a first distance in the second direction; and the second conductive films of the resistance elements are spaced from each other by a second distance in the second direction, the second distance being longer than the first distance.

According to another aspect of the invention, there is provided a semiconductor device comprising a semiconductor substrate including a semiconductor region surrounded by an element isolation region; a first insulating film formed on the semiconductor region; a pair of resistance elements located at the semiconductor region, each of the resistance elements including a first conductive film formed on the first insulating film, a second insulating film formed on the first conductive film and a second conductive film formed on the second insulating film; a pair of first contact plugs formed on one of the resistance elements, the first contact plugs being arranged along a first direction relative to the semiconductor region; and a pair of second contact plugs formed on the other of the resistance elements, the second contact plugs being arranged along the first direction, wherein one of the resistance elements has a first width in a second direction which is perpendicular to the first direction, and the semiconductor region has a second width in the second direction, the first width being smaller than half of the second width; and the second conductive film is divided between the contact plugs, the second insulating film includes a pair of openings located below the contact plugs respectively, and the first conductive film is electrically connected to the second conductive film through the openings.

According to further another aspect of the invention, there is provided a semiconductor device comprising a semiconductor substrate including a semiconductor region surrounded by an element isolation region; a first insulating film formed on the semiconductor region; a pair of resistance elements located at the semiconductor region, each of the resistance elements including a first conductive film formed on the first insulating film, a second insulating film formed on the first conductive film and a second conductive film formed on the second insulating film; a pair of first contact plugs formed on one of the resistance elements, the first contact plugs being arranged along a first direction relative to the semiconductor region; and a pair of second contact plugs formed on the other of the resistance elements, the second contact plugs being arranged along the first direction, wherein one of the resistance elements has a first width in a second direction which is perpendicular to the first direction, and the semiconductor region has a second width in the second direction, the first width being smaller than half of the second width; and the first conductive films adjacent therebetween, and the second conductive film adjacent in the second direction are disposed with a second distance therebetween, the first distance being smaller than the second distance.

BRIEF DESCRIPTION OF THE DRAWINGS

In the accompanying drawings,

FIGS. 1A and 1B are schematic plan views of resistance elements and a memory cell transistor of a NAND flash memory of an embodiment in accordance with the present invention;

FIGS. 5A to 5D are schematic longitudinal sections of the resistance elements and the memory cell transistor in another stage of the fabricating process (No. 2), respectively;

FIGS. 13A to 13D are schematic longitudinal sections of the resistance elements and the memory cell transistor in further another stage of the fabricating process (No. 8), respectively.

DETAILED DESCRIPTION OF THE INVENTION

Figure 2A:
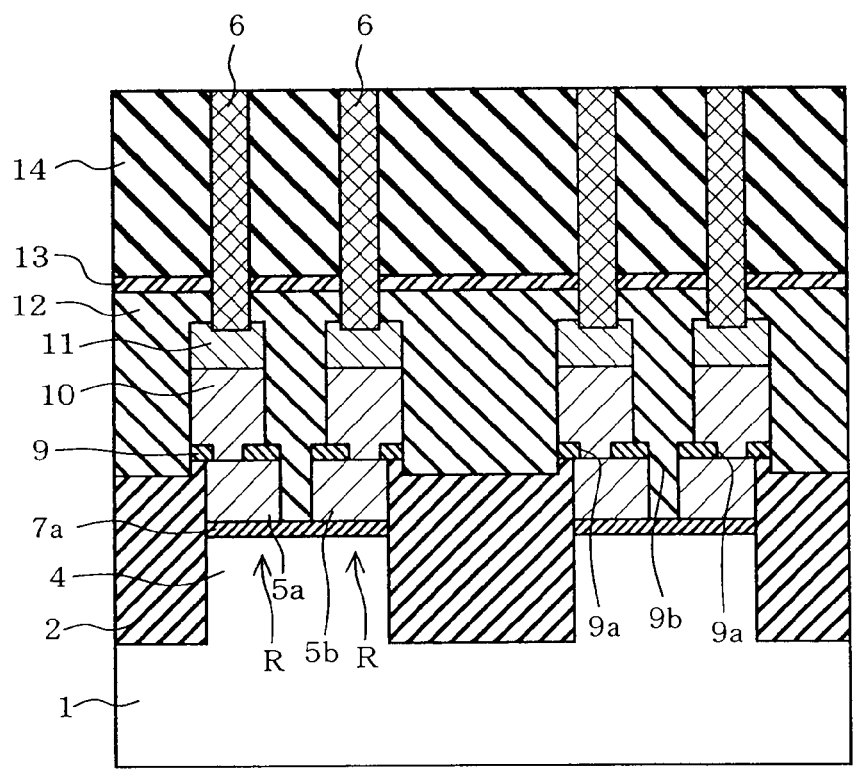
FIGS. 2A and 2B are schematic longitudinal sections of the resistance elements taken along lines 2A-2A and 2B-2B respectively.

One embodiment of the present invention will be described with reference to the accompanying drawings. The invention is applied to a NAND flash memory in the embodiment. In the following description, identical or similar parts are labeled by the same reference numerals. The drawings typically illustrate the invention, and the relationship between a thickness and plane dimension, layer thickness ratio and the like differ from respective natural dimensions.

The NAND flash memory of the embodiment includes a memory cell region where a number of memory cell transistors are provided and a peripheral circuit region where transistors, resistance elements and the like are provided for controlling the memory cell transistors. FIG. 1A shows a layout of the resistance elements formed in the peripheral circuit region. FIG. 1B shows a part of the memory cell region.

Referring to FIG. 1B, a plurality of band-shaped element isolation insulating films 2 are formed at a predetermined interval in a silicon substrate 1 serving as a semiconductor substrate so as to extend in the Y direction as viewed in FIG. 1B. The element isolation insulating films 2 serve as element isolation regions formed into a shallow trench isolation (STI) structure. A plurality of band-shaped active regions 3 serving as first semiconductor regions are formed along the Y direction as the result of provision of the element isolation insulating films 2, so as to be isolated from each other. The active regions 3 are formed into columns arranged in the X direction as viewed in FIG. 1B. Word lines WL of the memory cell transistors are formed so as to extend in the X direction perpendicular to the active regions 3 as viewed in FIG. 1B. Gate electrodes MG are provided in intersections of the active regions 3 and the word lines WL. Impurity diffusion regions 1a serving as source/drain regions are formed in portions of a surface layer of each active region 3 of the silicon substrate 1, which portions are located at opposite sides of each gate electrode MG. Each memory cell transistor is thus configured as described above.

Referring now to FIG. 1A, the peripheral circuit region is shown. Resistance elements R are provided in the peripheral circuit region in addition to other transistors provided for the peripheral circuit. The resistance elements R are formed by making use of a deposited structure of the gate electrodes of the memory cell transistors. An element isolation insulating film 2 is formed in the silicon substrate 1 as in the memory cell region. In this case, the element isolation insulating film 2 is formed so as to encompass a forming region of the resistance elements R, whereupon rectangular active regions 4 are formed so as to be isolated from each other. Two lengthwise columns of divided resistors 5a and 5b are formed on an upper surface of each active region 4. The resistors 5a and 5b constitute each resistance element R and are formed by processing first conductor layers 8 (films formed simultaneously with first conductor layers and designated by reference numeral "8" in FIGS. 3A and 3B). Each of the resistors 5a and 5b has both ends on which contact plugs 6 are formed respectively.

Figure 2B:
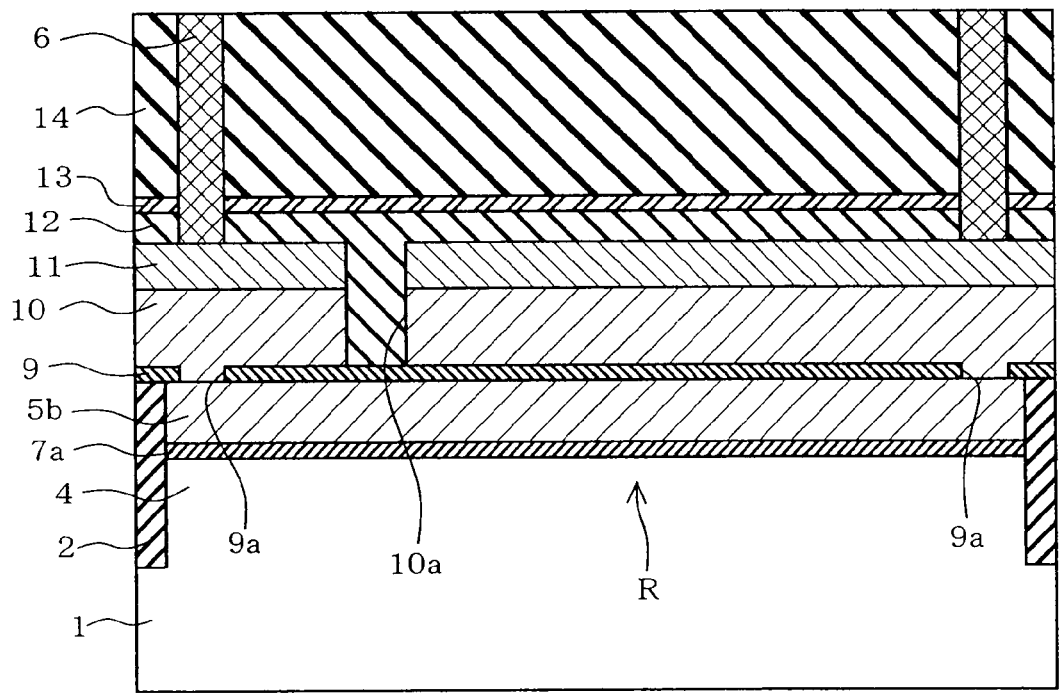
Figure 3A:
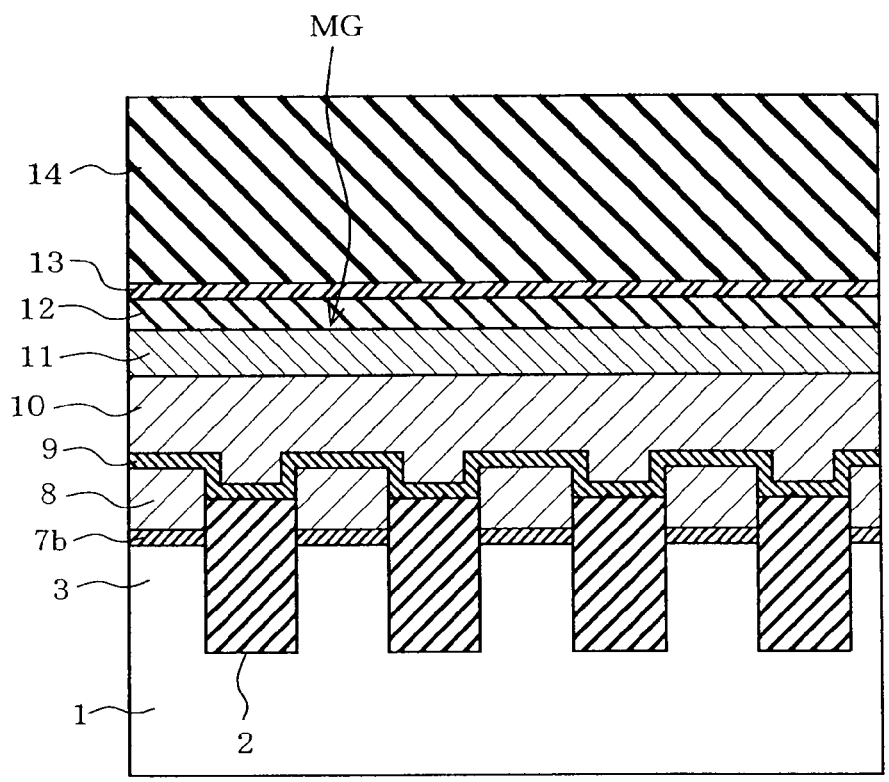
FIGS. 3A and 3B are schematic longitudinal sections of the memory cell transistor taken along lines 3A-3A and 3B-3B respectively.
Figure 3B:
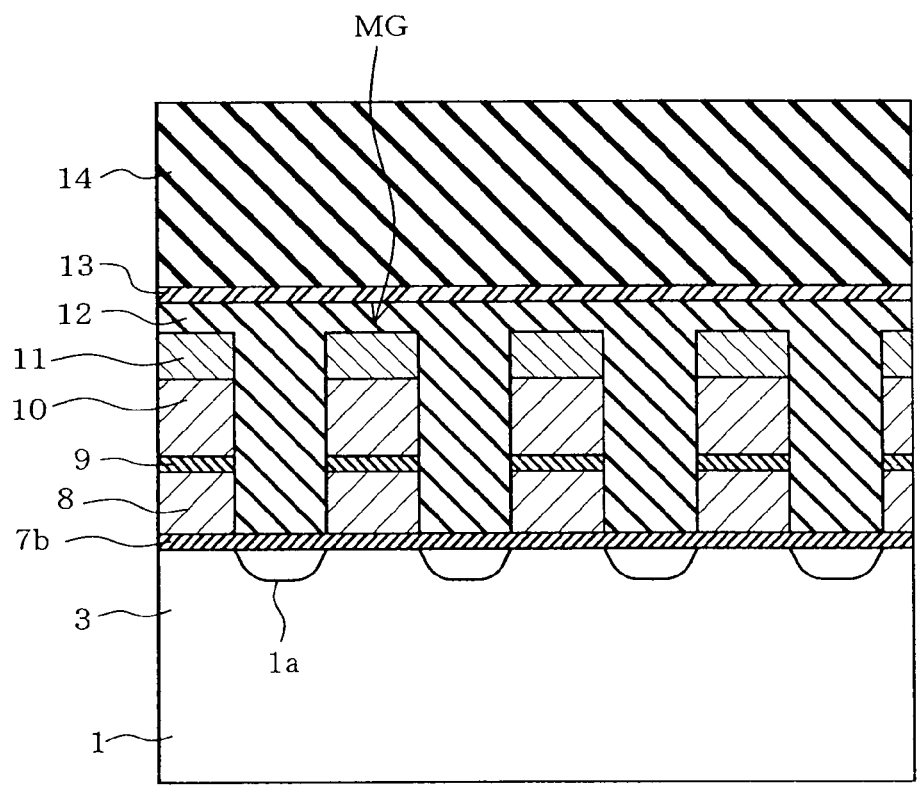

FIGS. 2A and 2B schematically show a sectional structure of each resistance element R. FIG. 2A shows a section taken along line 2A-2A in FIG. 1A which cuts across the adjacent resistors 5a and 5b at the location of the contact plugs 6. FIG. 2B shows a section taken along line 2B-2B in FIG. 1B which cuts the resistor 5b lengthwise at the location of the contact plugs 6. FIGS. 3A and 3B show a schematic sectional structure of the memory cell region. FIG. 3A shows a section taken along line 3A-3A in FIG. 1B which cuts across the element isolation insulating films 2 and the active regions 3. FIG. 3B shows a section taken along line 3B-3B in FIG. 1B which cuts along the active region 3 at the location of the contact plugs 6.

The sectional structure of the memory cell region will first be described with reference to FIGS. 3A and 3B. The silicon substrate 1 includes a surface layer in which the active regions 3 are formed so as to be isolated from each other by the element isolation insulating films 2, as shown in FIG. 3A. Gate insulating films 7b and polycrystalline silicon layers 8 are formed on the upper surfaces of the respective active regions 3. The gate insulating films 7b and the polycrystalline silicon layers 8 have the same width as the active regions 3. The polycrystalline silicon layers 8 serve as first conductor layers (conductive films). The first conductor layers 8 are formed into floating gate electrodes. Each first element isolation insulating film 2 is formed so as to reach intermediate portions of sidewalls of the first conductor layers 8 adjacent to both sides of each first element isolation insulating film 2. A second insulating film 9 comprising an oxide-nitride-oxide (ONO) film is deposited over upper surfaces of the element isolation insulating films 2 and first conductor layers 8.

Furthermore, a second conductor layer (conductive film) 10 is deposited on an upper surface of the second insulating film 9. The second conductor layer 10 comprises a polycrystalline silicon film serving as a control gate electrode. A cobalt silicide ($CoSi_2$) film 11 is formed on an upper surface of the second conductor layer 10. The second conductor layer 10 and the cobalt silicide film 11 extend between the adjacent first conductor layers 8 with the element isolation insulating film 2 being interposed between the first conductor layers 8, serving as word lines WL.

Referring now to FIG. 3B, the first conductor layers 8 serving as the floating gate electrodes are formed along the active regions 3 of the silicon substrate 1 so as to be isolated from each other. Impurity diffusion regions 1a are formed in portions of surface layer of the silicon substrate 1 located between the adjacent first conductor layers 8 respectively. The impurity diffusion regions 1a serve as source/drain regions. The second insulating films 9, the second conductor layers 10 and the cobalt silicide films 11 are formed sequentially on the upper surfaces of the first conductor layers 8, respectively, whereby the gate electrodes MG are formed. An interlayer insulating film 12 is deposited so as to fill spaces between the adjacent gate electrodes MG. A silicon nitride film 13 and an interlayer insulating film 14 are deposited in turn on the interlayer insulating film 12.

The configuration of each resistance element R will now be described with reference to FIGS. 2A and 2B. Each resistance element R is formed utilizing the configuration of the film in the case where the gate electrodes MG of the memory cell transistors are formed. More specifically, first insulating films 7a are formed on the entire surfaces of the elongate rectangular active regions 4 which are formed by isolating the silicon substrate 1 by the element isolation insulating films 2. The resistors 5a and 5b are deposited on upper surfaces of the first insulating films 7a by isolating the first conductor layers 8 each into two columns. Second insulating films 9 are deposited on the upper surfaces of the resistors 5a and 5b. Each second insulating film 9 has both lengthwise ends in which generally rectangular openings 9a provided for contacts are formed respectively. Furthermore, the second insulating films 9 are formed so as to slightly protrude out of the resistors 5a and 5b both widthwise and lengthwise beyond the active regions 4, whereupon the second insulating films 9 protrude onto the element isolation insulating films 2.

The second conductor layers 10 and the cobalt silicide layers 11 are formed in turn on the upper surface of the second insulating films 9. The second conductor layers 10 and the cobalt silicide layers 11 are formed so as to be isolated into two columns in the same manner as the resistors 5a and 5b as shown in FIG. 2A. The second conductor layers 10 and the cobalt silicide layers 11 are further isolated at respective lengthwise portions. Still furthermore, the second conductor layers 10 are formed so as to be in electrical contact with the lower first conductor layer 8 through the openings 9a of the second insulating films 9. The interlayer insulating films 12, the silicon nitride films 13 and the interlayer insulating films 14 are deposited on the upper surfaces of the second insulating films 9. The contact plugs 6 are formed through the interlayer insulating film 14, the silicon nitride film 13 and the interlayer insulating film 12 so as to be in electrical contact with the cobalt silicide films 11.

Since the above-described configuration is employed, the two columns of resistors 5a and 5b are provided in each active region 4. Accordingly, even when the formable minimum width of each active region 4 is limited on the fabrication process, each of the resistors 5a and 5b has a smaller width than each active region 4. Consequently, the resistance value of each resistance element R can be rendered larger in the conventional configuration. Moreover, since the above-described configuration results in no increase in the pattern size, a compact resistance element with high accuracy can be provided.

Figure 8:
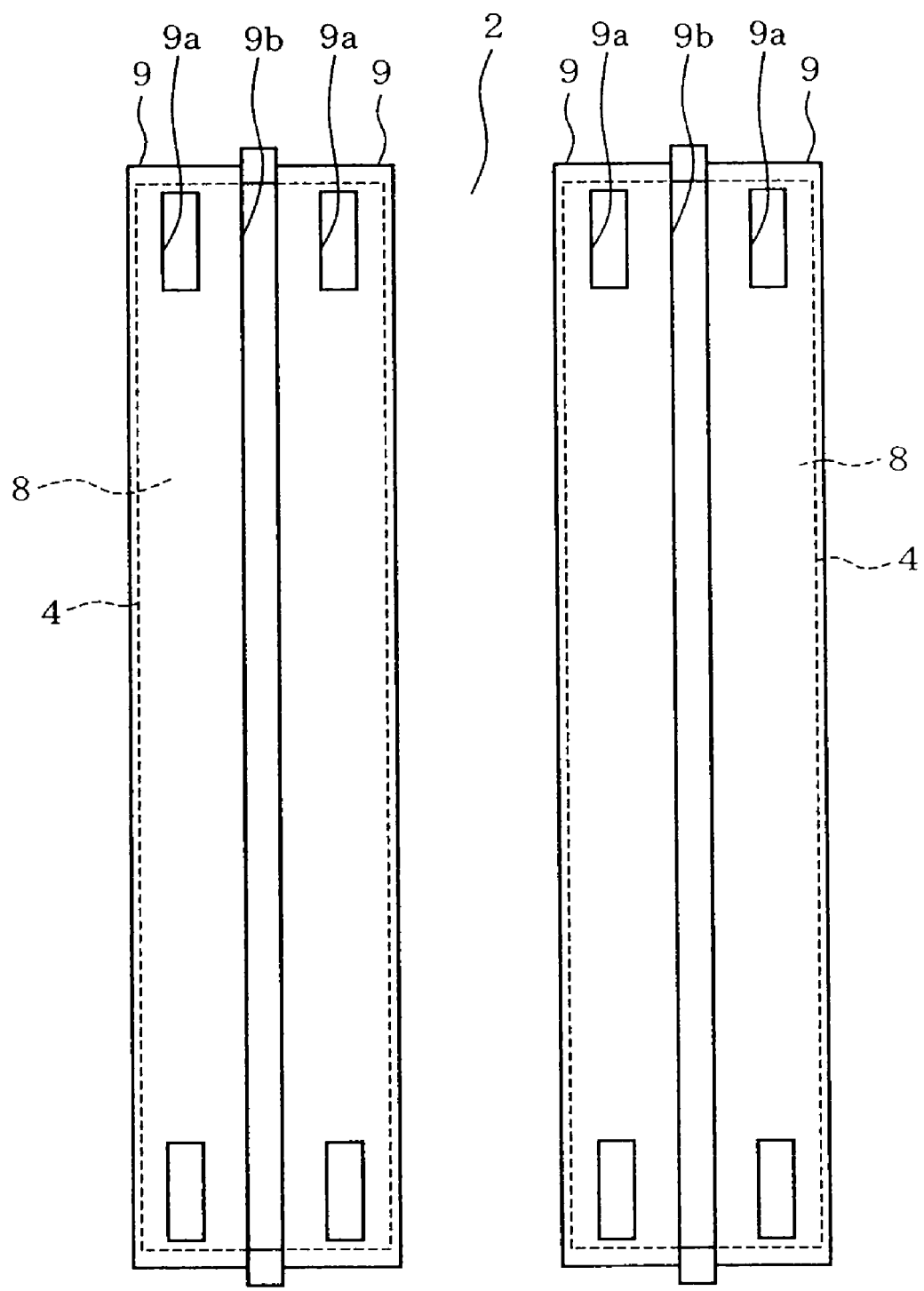
FIG. 8 is a schematic plan view of the resistance elements in the stage as shown in FIGS. 7A-7D.
Figure 9C:
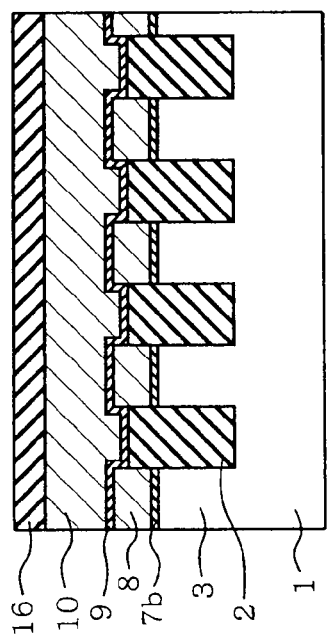
FIGS. 9A to 9D are schematic longitudinal sections of the resistance elements and the memory cell transistor in further another stage of the fabricating process (No. 5), respectively.
Figure 9D:
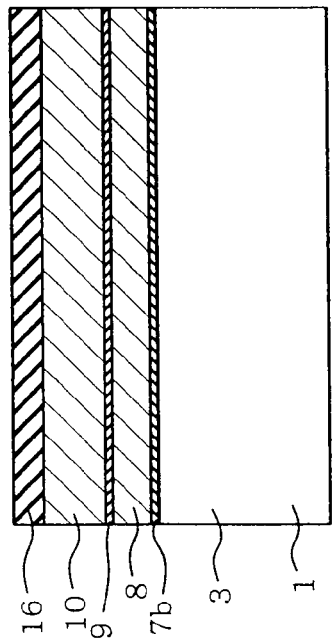
Figure 9A:
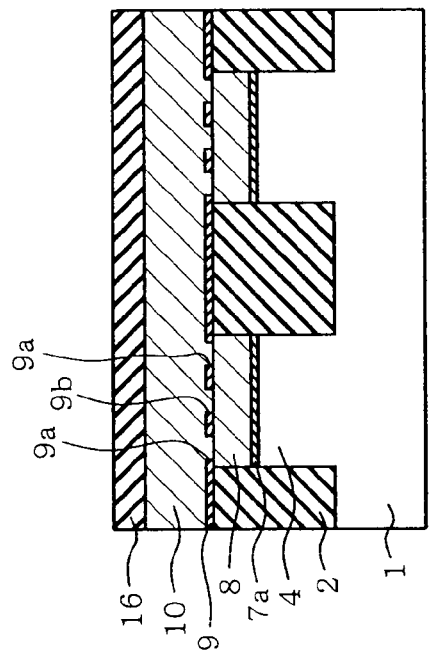
Figure 9B:
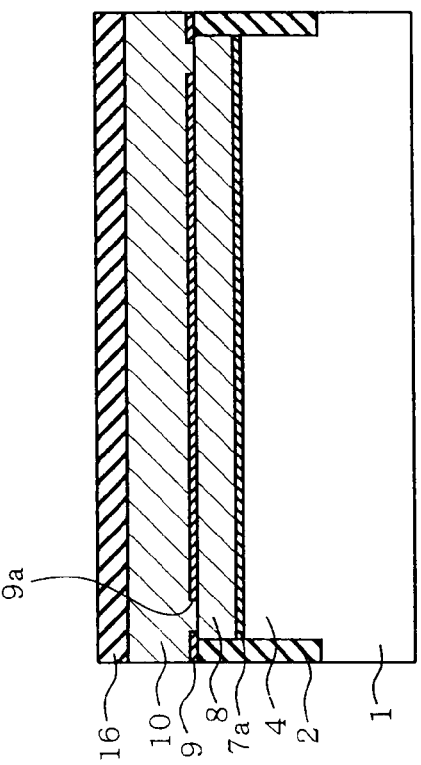

A method of fabricating the NAND flash memory of the embodiment will be described with reference to FIGS. 4A to 13D. The figures except FIGS. 8 and 12 show schematic sections. Of FIGS. 4A to 13D, the figure numbers suffixed with A and B correspond to FIGS. 2A and 2B respectively. The figure numbers suffixed with C and D correspond to FIGS. 3A and 3B respectively. Furthermore, FIGS. 8 and 12 are schematic plan views of the resistance elements R in the fabrication stages as shown in FIGS. 7 and 11 respectively.

Figure 4C:
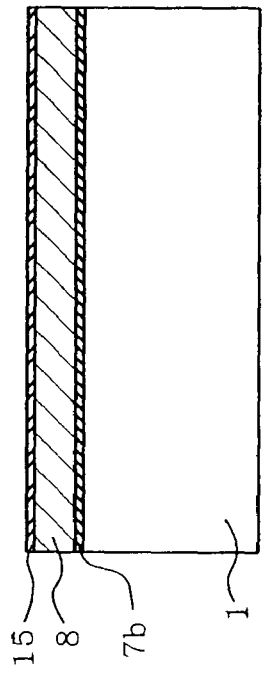
FIGS. 4A to 4D are schematic longitudinal sections of the resistance elements and the memory cell transistor taken along lines 2A-2A, 2B-2B, 3A-3A and 3B-3B in a stage of the fabricating process (No. 1), respectively.
Figure 4D:
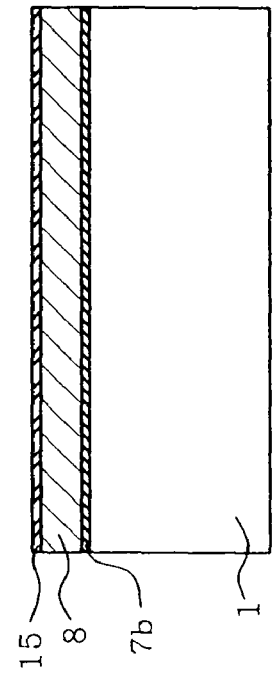
Figure 4A:
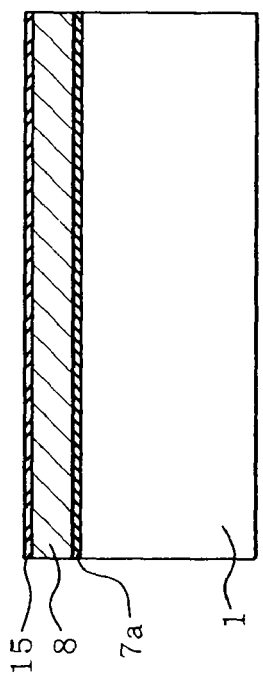
Figure 4B:
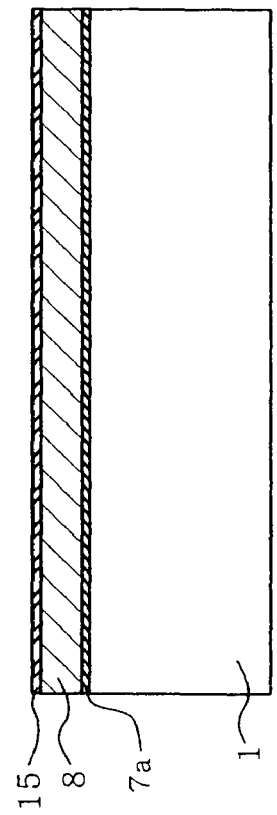

Firstly, a silicon oxide film is formed on the upper surface of the silicon substrate 1 after ion implantation has been carried out for the forming of wells and channel regions in the silicon substrate, as shown in FIGS. 4A to 4D. The silicon oxide film serves as the first insulating film 7a which is further formed into a high-voltage transistor gate oxide film having a large film thickness (35 nm, for example). Subsequently, the first insulating film 7a formed in a low-voltage transistor region of the peripheral circuit region and a memory cell region as shown in FIGS. 4A and 4D is selectively removed, and thereafter, a silicon oxide film having a large film thickness (8 nm, for example) is formed as a first insulating film 7b on the upper surface of the silicon substrate 1. Thus, the film thickness of the gate oxide film is changed according to the region. The first insulating film 7b serves as the tunnel oxide film. In this case, the first insulating film 7a is formed in the portion which is shown in FIGS. 4A and 4B and in which the resistance elements R are to be formed. Next, the polycrystalline silicon films are deposited as the first conductor layers 8 on the upper surfaces of the first insulating films 7a and 7b by a film thickness of about 100 nm. The polycrystalline silicon films serve as floating gate electrodes. Thereafter, a silicon nitride film 15 is deposited on the polycrystalline silicon films as a mask material.

Subsequently, a resist is patterned by a known photolithographic process so that a mask is provided for forming the element isolation regions, as shown in FIGS. 5A to 5D. Thereafter, an etching process is carried out by a reactive ion etching (RIE) process with the resist serving as a mask in order to process the silicon nitride film 15. Subsequently, the first conductor layers 8 and the first insulating films 7a and 7b are etched with the silicon nitride film 15 serving as a mask, and the silicon substrate 1 is etched until a predetermined depth is reached, whereby trenches 1b and 1c are formed. In this case, the trench 1b is formed so as to rectangularly encompass the active region 4 which is to be formed into the active region 4, whereas the trench 1c is formed so as to provide the band-shaped active region 3 which is to be formed into the memory cell transistors. Furthermore, the width of the active region 4 is defined by a lithography minimum design rule for peripheral circuit region. For example, the width of the active region 4 is set so as to be several times larger than a pattern width of the memory cell region.

Figure 6A:
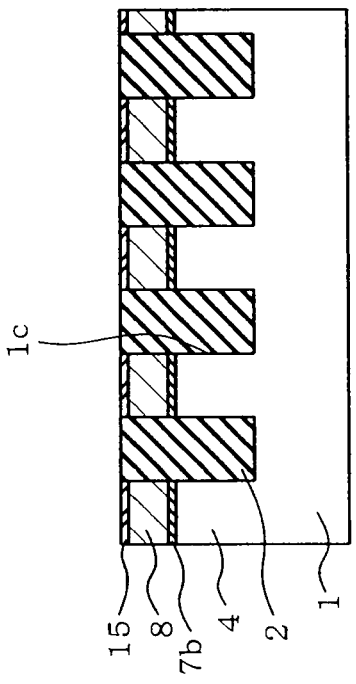
FIGS. 6A to 6D are schematic longitudinal sections of the resistance elements and the memory cell transistor in further another stage of the fabricating process (No. 3), respectively.
Figure 6B:
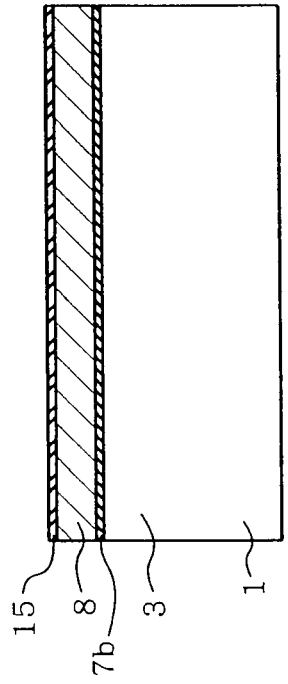
Figure 6C:
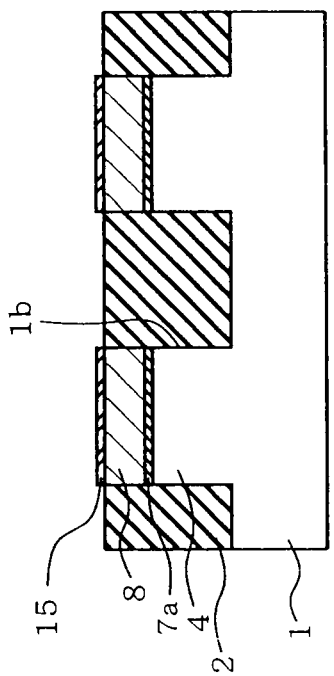
Figure 6D:
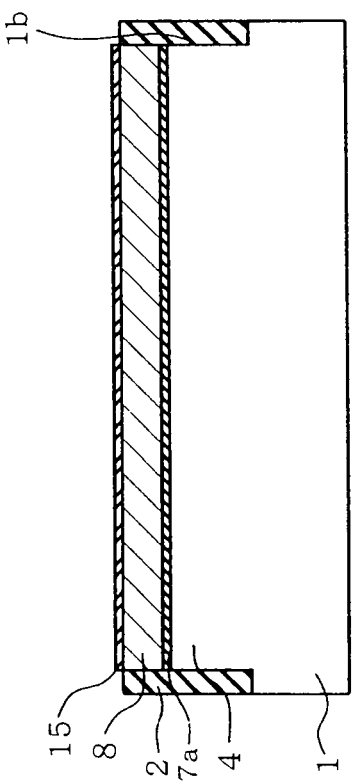
Figure 7A:
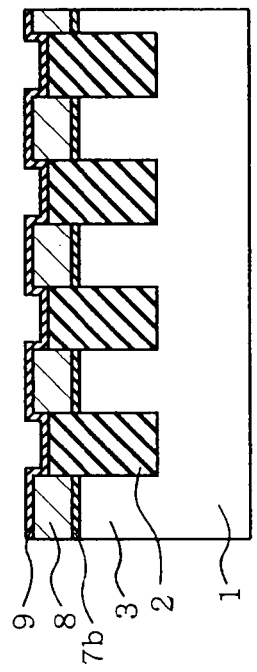
FIGS. 7A to 7D are schematic longitudinal sections of the resistance elements and the memory cell transistor in further another stage of the fabricating process (No. 4), respectively.
Figure 7B:
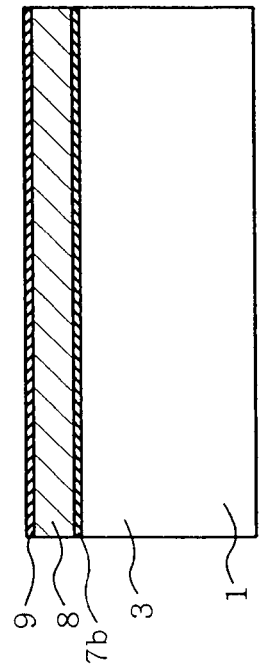
Figure 7C:
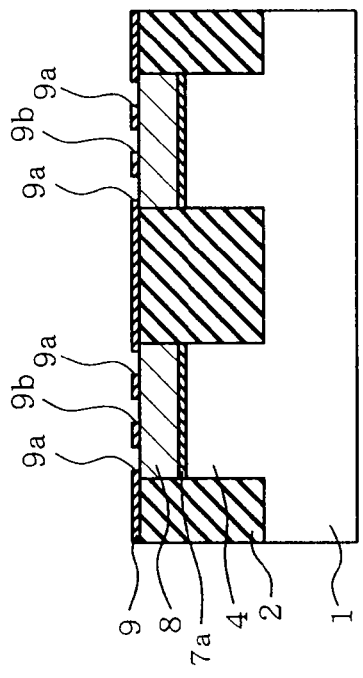
Figure 7D:
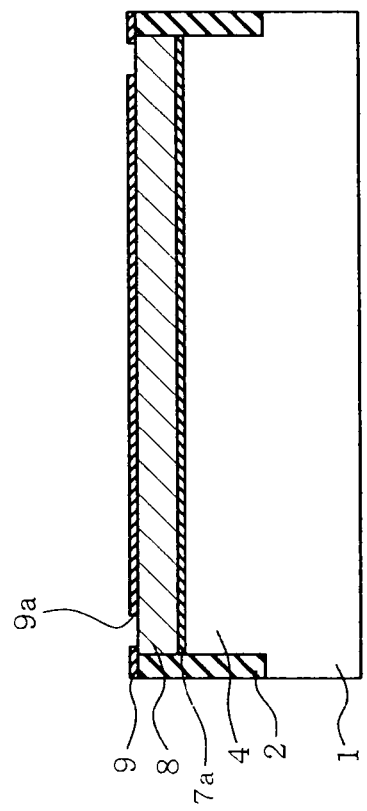

Subsequently, a silicon oxide film is buried in the trenches 1b and 1c so that the element isolation insulating films 2 are formed, as shown in FIGS. 6A to 6D. In this case, the silicon oxide film to be buried may be formed by a chemical vapor deposition (CVD) process or may be a coating type silicon oxide film. Parts of the silicon oxide film protruding out of the trenches 1b and 1c are planarized by a chemical mechanical polishing (CMP) treatment in which the silicon nitride film 15 is used as a stopper, or the like, whereupon the silicon oxide film is buried as shown in FIGS. 6A-6B.

Subsequently, an etch-back process is carried out for the silicon oxide film of the element isolation insulating film 2 in the memory cell region, so that the upper surface of the element isolation insulating film 2 is caused to sink substantially to an intermediate position on the sidewall of the first conductor layer 8. Subsequently, the ONO film is formed as the second insulating film 9 corresponding to an intergate insulating film formed between the floating gate electrode and the control gate electrode of the gate electrode MG of the memory cell transistor. Alternatively, a nitride-oxide-nitride-oxide-nitride (NONON) film may be used, instead of the ONO film. In this case, a slot plane antenna (SPA) nitridation treatment is carried out before and after the forming of the ONO film so that thin silicon nitride films are formed on upper and lower portions of the ONO film respectively. Still alternatively, a film with a high relative permittivity may be interposed in an intermediate layer of either ONO or NONON film.

Subsequently, short-circuiting openings are formed through the second insulating film 9 in order that the gate electrodes of a selective gate section in the memory cell region and of each transistor in the peripheral circuit region may be configured so as not to have a floating gate electrode. As a result, upper and lower sides of the second insulating film 9 are at the same potential. Furthermore, contact-forming openings 9a and a slit-like opening 9b are formed regarding the resistance elements R in the peripheral circuit region. The slit-like opening 9b is provided for dividing the first conductor layer 8 into two columns. Although the slit-like opening 9b is formed so as to divide an upper part of the active region 3 into two parts, both ends of the opening 9b protrude to the element isolation insulating film 2.

Subsequently, a polycrystalline silicon film for forming the control gate electrodes is formed as a second conductor layer 10 on an upper surface of the above-described configuration as shown in FIGS. 9A to 9D. A silicon nitride film 16 is deposited on the second conductor layer 10. The silicon nitride film 16 serves as a mask material for the forming of gate electrodes. Subsequently, a lithographic treatment is carried out, and patterning is carried out by the RIE process for the forming of the gate electrodes MG and the resistance elements R, as shown in FIGS. 10A to 10D. Since the process is carried out so that the remaining second conductor layer 10 is larger than an outer configuration of the active region 4, a resist pattern is formed so as to be larger to the side of the element isolation insulating film 2.

Subsequently, the silicon nitride film 16 and the second conductor layer 10 are first etched in turn. Next, when the second insulating film 9 is etched, overetching is carried out so that an upper portion of the element isolation insulating film 2 of the element isolation region is removed until a predetermined height is reached. The second insulating film 9 formed on the sidewall of the floating gate electrode in the memory cell region is removed. Furthermore, the element isolation insulating film 2 extends up to the level of the upper surface of the first conductor layer 8 in the peripheral circuit region. An upper portion of the element isolation insulating film 2 is removed simultaneously with the removal of the second insulating film 9 until a predetermined height is reached. Thereafter, the polycrystalline silicon film of the first conductor layer 8 is etched with higher selectivity being given thereto than the first insulating film 7.

Figure 10A:
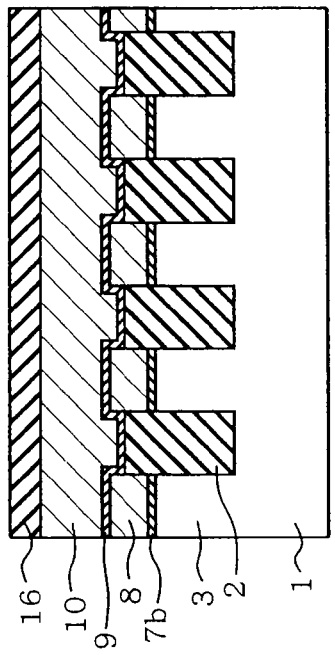
FIGS. 10A to 10D are schematic longitudinal sections of the resistance elements and the memory cell transistor in further another stage of the fabricating process (No. 6), respectively.
Figure 10C:
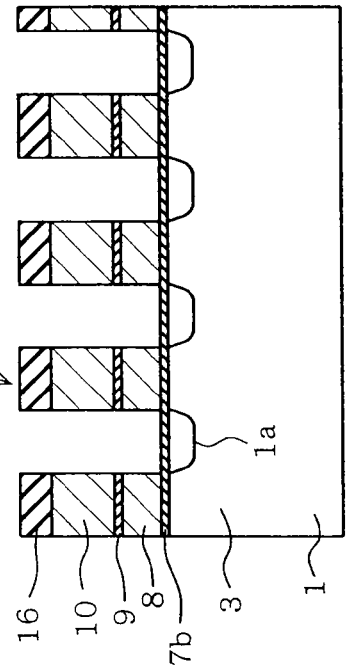
Figure 10B:
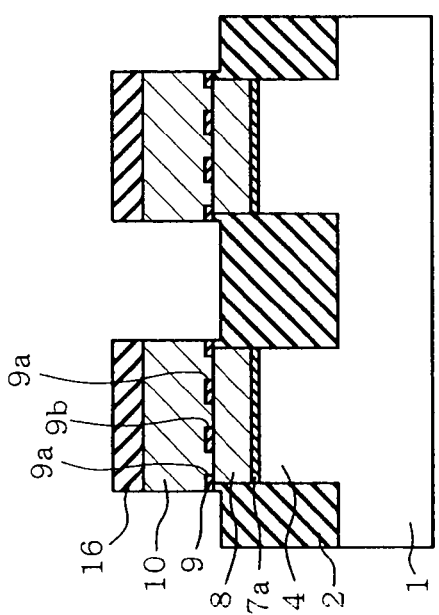
Figure 10D:
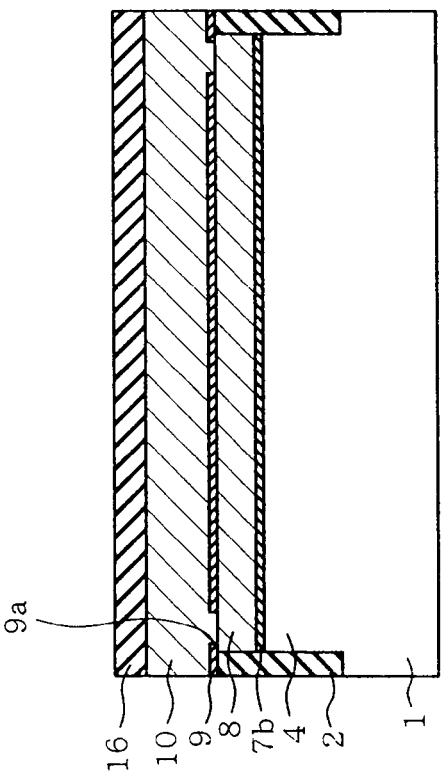

Consequently, the gate electrodes MG are formed individually in the memory cell region as shown in FIG. 10D. Thereafter, the first insulating film 7a formed as a thick gate insulating film provided on the active region of the silicon substrate 1 is removed by etching. In this state, impurities are introduced into the surface layer of the silicon substrate 1 by an ion implantation process so that the impurity diffusion region 1a is formed. The impurity diffusion region 1a is formed in a portion of the silicon substrate 1 located between the adjacent gate electrodes MG, serving as a source/drain region.

Figure 11A:
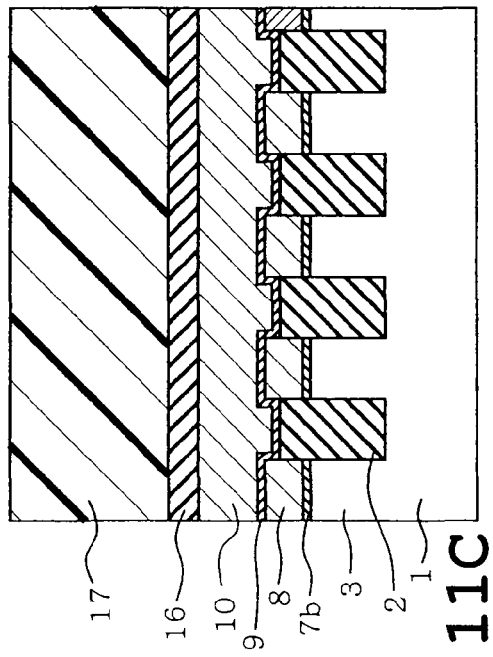
FIGS. 11A to 11D are schematic longitudinal sections of the resistance elements and the memory cell transistor in further another stage of the fabricating process (No. 7), respectively.
Figure 11C:
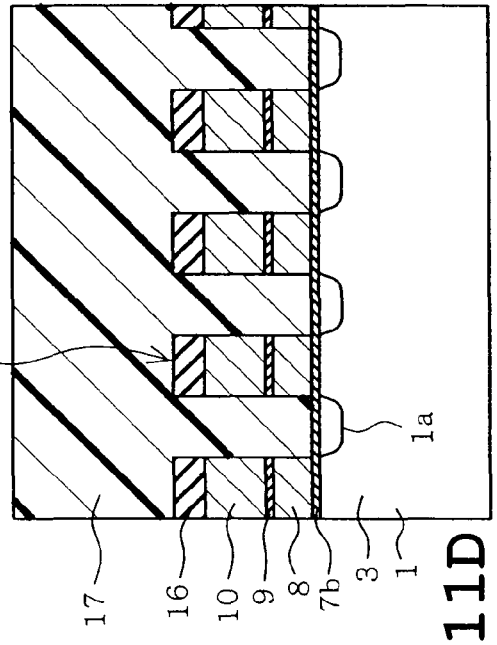
Figure 11B:
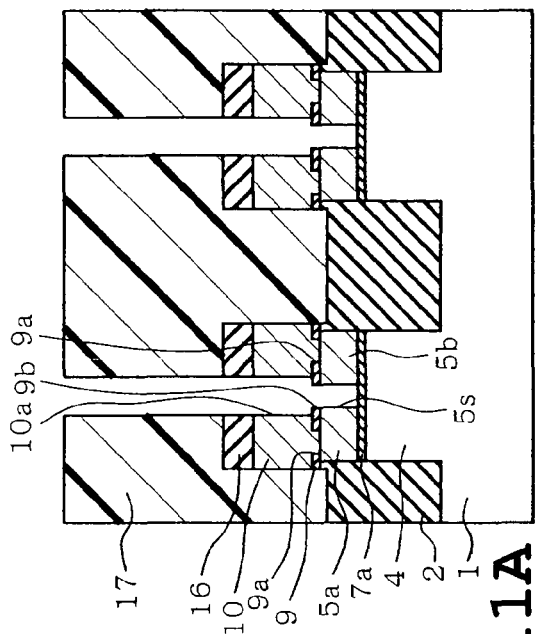
Figure 11D:
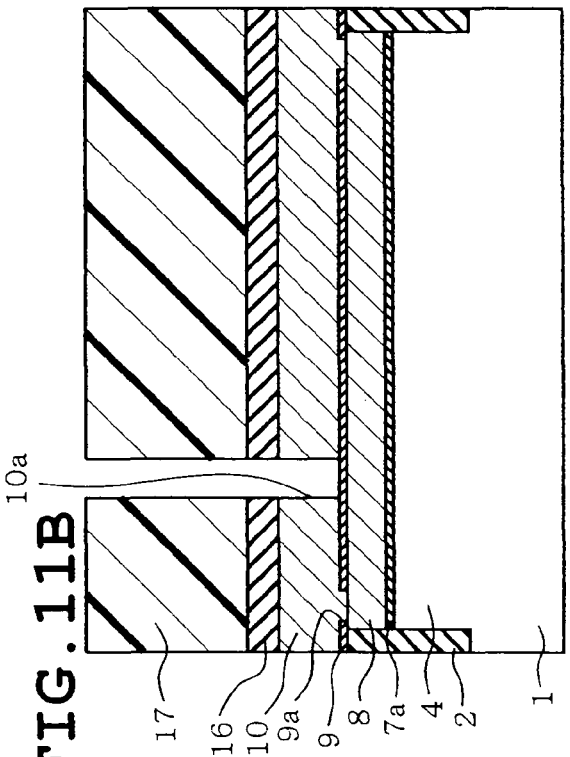
Figure 12:
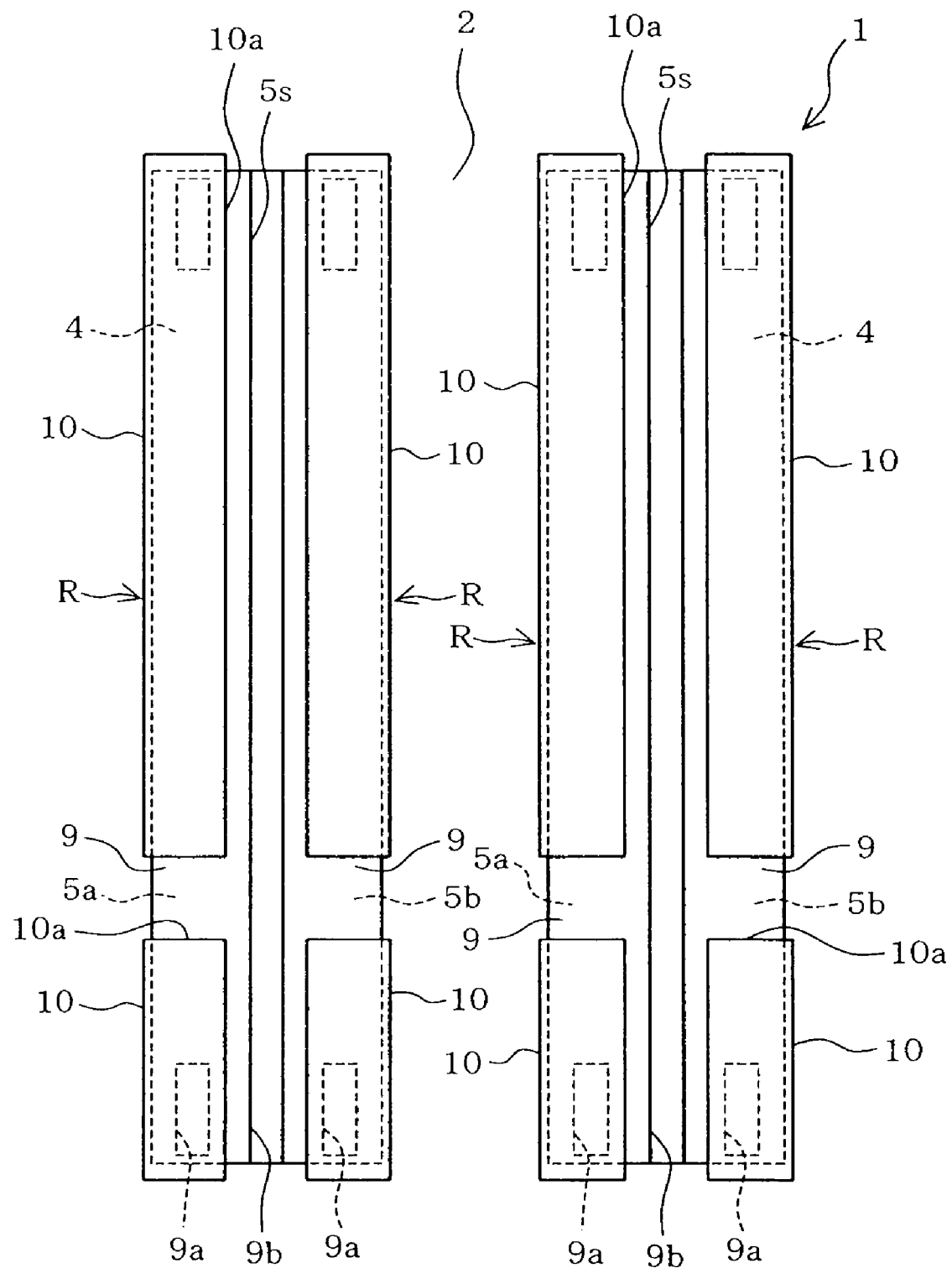
FIG. 12 is a schematic plan view of the resistance elements in the stage as shown in FIGS. 11A-11D.

Subsequently, a lithographic process is carried out to form a resist pattern necessary for removing the resistance elements R and the second conductor layer 10 of the capacitor section as shown in FIGS. 11A to 12. The second conductor layer 10 on the second insulating film 9 is removed in this process, and the memory cell region is completely covered with a resist. In this case, the second conductor layer 10 and the first conductor layer 8 are divided in the forming region of the resistance elements R into two lengthwise columns, and the second conductor layer 10 is isolated at a lengthwise part thereof. As a result, a resist pattern having a cross-shaped trench is formed.

Subsequently, an etching process is carried out by the RIE method with the resist pattern serving as a mask. Firstly, the silicon nitride film 16 and the second conductor layer 10 are etched thereby to be removed while a higher selectivity is given to the silicon nitride film 16 and the second conductor layer 10 than the second insulating film 9. The first conductor layer 8 is then etched while a higher selectivity is given to the first conductor layer 8 than the first insulating films 7a and 7b and the second insulating film 9. As a result, the second conductor layer 10 is divided into four portions as shown in FIG. 12, and the first conductor layer 8 on the active region 4 of the silicon substrate 1 is isolated in a self-aligned manner along the pattern of the slit-like opening 9b of the second insulating film 9, whereupon the two lengthwise columns of resistors 5a and 5b are formed.

Subsequently, a silicon oxide film with a predetermined film thickness, such as a tetraethyl orthosilicate (TEOS) film, is formed, and thereafter, an etchback process is carried out for provision of spacers. The impurity diffusion region is formed for a transistor employing a lightly doped drain (LDD) structure by utilizing the formed spacers. After the TEOS film and the silicon nitride film have been formed, an interlayer insulating film (a part of the interlayer insulating film 12 as shown in FIGS. 13A-13D) comprising a boro-phospho-silicate glass (BPSG) film is formed so as to be buried in spaces between the adjacent gate electrodes. Thereafter, a planarizing process is carried out by the CMP method. The silicon nitride film is provided for preventing diffusion of impurities from the BPSG film of the interlayer insulating film and diffusion of an oxidant during thermal treatment for high density.

Subsequently, the silicon nitride film 16 as the mask material is removed such that the upper surface of the second conductor layer 10 is exposed. A cobalt (Co) film is deposited on the upper surface of the second conductor layer 10 and thermally treated at a predetermined temperature so that the upper portion of the polycrystalline silicon film of the second conductor layer 10 is silicized by the cobalt, whereby a cobalt silicide ($CoSi_2$) film 11 is formed. Subsequently, a plasma TEOS film with a predetermined film thickness is deposited on the interlayer insulating film so that an interlayer insulating film 12 as shown in FIGS. 13A to 13D is formed. A silicon nitride film 13 serving as a barrier film is deposited on an upper surface of the interlayer insulating film 12. Furthermore, an interlayer insulating film 14 comprising a plasma TEOS film is deposited on an upper surface of the silicon nitride film 13.

Subsequently, in order that gate top contacts of the resistance elements R and other transistors, substrate top contacts and the like may be formed, a lithographic treatment is carried out to form contact holes in the interlayer insulating film 14, silicon nitride film 13, interlayer insulating film 12 and the like, as shown in FIGS. 2A to 3B. Subsequently, contacts 6 and the like are formed through a process of burying a contact metal in the contact holes. In this case, the contacts in the peripheral circuit region employ a dual damascene structure. A trench serving as a wiring is formed, and a Ti/TiN film serving as a barrier metal is formed by the CMP process. Thereafter, the trench is filled with a metal such as tungsten (W) by the CVD method, whereby the bit line contacts and wiring layer are formed. Next, planarization is carried out by the CMP method such that the configuration as shown in the figures is obtained. Subsequently, when a back end process has been carried out, the fabrication of the NAND flash memory is completed.

According to the foregoing embodiment, the peripheral circuit region includes the active region 4 where the resistance elements are formed. The first conductor layer 8 on the active region 4 is divided into two columns of the resistors 5a and 5b. Consequently, stable high-resistive resistance elements R can be obtained without an increase in the pattern size. Furthermore, the opening pattern of the resist in the dividing of the second conductor layer 10 is formed so as to have a width larger than the width of the slit-like opening 9b of the second insulating film in the forming of the resistors 5a and 5b. The first conductor layer 8 is then etched while being given a higher selectivity than the second insulating film 9. The resistors 5a and 5b can be formed in the self-aligned manner so as to have respective widths smaller than the minimum design of the control gate electrode.

The step of forming the slit-like openings 9b in the second insulating film 9 can be carried out simultaneously with the step of forming the openings in the second insulating film 9 in order that the first conductor layers 8 may be short-circuited in the selective gate electrode of the memory cell region and the transistors of the peripheral circuit region. Consequently, the step of forming the slit-like openings 9b can be carried out only by pattern change without an increase in the number of steps of the lithography process. Furthermore, when the resistance elements R are formed, the step of isolating the second conductor layer 10 can be carried out simultaneously with the step of removing the second conductor layer 10 in capacitors and transistors of the peripheral circuit region. Consequently, the step of isolating the second resistance elements can be carried out only by pattern change without an increase in the number of steps of the lithography process.

When the resistance elements R are formed, the forming region of the second conductor layer 10 is formed so as to protrude lengthwise out of the forming portions of the active region 4 and the first conductor layer 8, thereby reaching the element isolation insulating film 2. This configuration results in the following advantage in the fabrication process. That is, the opening 9b formed in the second insulating film 9 into the slit-shape in order that the first conductor layers 8 are divided so as to be arranged lengthwise in two columns. In this case, when the forming region of the second conductor layer 10 is identical with the active region 4, there is a possibility that the silicon substrate 1 may be damaged at the end of the active region 4. However, the above-described configuration can prevent the damage in the foregoing embodiment.

Furthermore, since the second conductor layers 10 are formed so as to protrude nearer to the element isolation insulating film 2 side than the first conductor layers 8, treatments can be carried out while the resistors 5a and 5b are completely covered with the second conductor layers 10. Consequently, a sufficient margin can be ensured with respect to the pattern dimensions, and the resistors 5a and 5b can be formed under predetermined design conditions.

The invention should not be limited by the foregoing embodiment. The embodiment may be modified or expanded as follows. Although the resistors 5a and 5b are formed by dividing each first conductor layer 8 on the active region 4 at the center of the layer in the foregoing embodiment, each first conductor layer 8 may be divided at a part thereof other than the center according to a necessary resistance value of the resistor so that the divided portions have different widths. Although two columns of resistors 5a and 5b are formed in the single active region 4 of the silicon substrate 1 in the foregoing embodiment, three or more columns of resistors may be formed.

Each second conductor layer 10 may be divided at the above-described position in the foregoing embodiment. However, each second conductor layer 10 may be divided at an opposite position or intermediate position, or the width of divided portion may be increased. Furthermore, each second conductor layer 10 may be divided at a plurality of positions. Thus, each second conductor layer 10 may be divided at any position between the contact plugs 6 in both ends thereof.

The first and second conductor layers 8 and 10 may be formed from an amorphous silicon film or another conductor layer, instead of the polycrystalline silicon film. The second conductor layer 10 may be formed from a nickel silicide ($NiSi_2$) film, a titanium silicide ($TiSi_2$) film, a tantalum silicide ($TaSi_2$), a platinum silicide ($PtSi_2$), a tungsten silicide ($WSi_2$) or the like. Each contact plug 6 may be formed from any metal other than tungsten.

The second conductor layer 10 may be used as resistor instead of the first conductor layer 8. The above-mentioned resistance element may be applied to a logic device.

The foregoing description and drawings are merely illustrative of the principles and are not to be construed in a limiting sense. Various changes and modifications will become apparent to those of ordinary skill in the art. All such changes and modifications are seen to fall within the scope as defined by the appended claims.

What is claimed is:
1. A semiconductor device comprising:
a semiconductor substrate including a semiconductor region surrounded with by an element isolation region;
a first insulating film formed on the semiconductor region;
a pair of resistance elements located at the semiconductor region, each of the resistance elements including a first conductive film formed on the first insulating film, a second insulating film formed on the first conductive film and a second conductive film formed on the second insulating film;
a pair of first contact plugs formed on one of the resistance elements, the first contact plugs being arranged along a first direction relative to the semiconductor region; and
a pair of second contact plugs formed on the other of the resistance elements, the second contact plugs being arranged along the first direction,
wherein one of the resistance elements has a first width in a second direction which is perpendicular to the first direction, and the semiconductor region has a second width in the second direction, the first width being smaller than half of the second width;
the second insulating films of the resistance elements are spaced from each other by a first distance in the second direction; and the second conductive films of the resistance elements are spaced from each other by a second distance in the second direction, the second distance being longer than the first distance.

2. The semiconductor device according to claim 1, wherein the first conductive film has the first width.

3. The semiconductor device according to claim 1, wherein the second conductive film has the first width.

4. A semiconductor device, comprising:
a semiconductor substrate including a semiconductor region surrounded by an element isolation region;
a first insulating film formed on the semiconductor region;
a pair of resistance elements located at the semiconductor region, each of the resistance elements including a first conductive film formed on the first insulating film, a second insulating film formed on the first conductive film and a second conductive film formed on the second insulating film;
a pair of first contact plugs formed on one of the resistance elements, the first contact plugs being arranged along a first direction relative to the semiconductor region; and
a pair of second contact plugs formed on the other of the resistance elements, the second contact plugs being arranged along the first direction,
wherein one of the resistance elements has a first width in a second direction which is perpendicular to the first direction, and the semiconductor region has a second width in the second direction, the first width being smaller than half of the second width; and
the second conductive film is divided between the contact plugs, the second insulating film includes a pair of openings located below the contact plugs respectively, and the first conductive film is electrically connected to the second conductive film through the openings.

5. A semiconductor device, comprising:
a semiconductor substrate including a semiconductor region surrounded by an element isolation region;
a first insulating film formed on the semiconductor region;
a pair of resistance elements located at the semiconductor region, each of the resistance elements including a first conductive film formed on the first insulating film, a second insulating film formed on the first conductive film and a second conductive film formed on the second insulating film;
a pair of first contact plugs formed on one of the resistance elements, the first contact plugs being arranged along a first direction relative to the semiconductor region; and
a pair of second contact plugs formed on the other of the resistance elements, the second contact plugs being arranged along the first direction,
wherein one of the resistance elements has a first width in a second direction which is perpendicular to the first direction, and the semiconductor region has a second width in the second direction, the first width being smaller than half of the second width; and
the first conductive films adjacent in the second direction are disposed with a first distance therebetween, and the second conductive films adjacent in the second direction are disposed with a second distance therebetween, the first distance being smaller than the second distance.

6. The semiconductor device according to claim 1, wherein the second conductive film is protruded above the element isolation region.

7. A semiconductor device according to claim 1, comprising:
a semiconductor substrate including a semiconductor region surrounded by an element isolation region;
a first insulating film formed on the semiconductor region;
a pair of resistance elements located at the semiconductor region, each of the resistance elements including a first conductive film formed on the first insulating film, a second insulating film formed on the first conductive film and a second conductive film formed on the second insulating film;
a pair of first contact plugs formed on one of the resistance elements, the first contact plugs being arranged along a first direction relative to the semiconductor region; and
a pair of second contact plugs formed on the other of the resistance elements, the second contact plugs being arranged along the first direction,
wherein one of the resistance elements has a first width in a second direction which is perpendicular to the first direction, and the semiconductor region has a second width in the second direction, the first width being smaller than half of the second width; and
the first conductive film has a first length in the first direction, and the semiconductor region has a second length in the first direction, the first length being the same as the second length.

8. The semiconductor device according to claim 1, wherein the first and second conductive films include respective polycrystalline silicon films.

9. A semiconductor device, comprising:
a semiconductor substrate including a semiconductor region surrounded by an element isolation region;
a first insulating film formed on the semiconductor region;
a pair of resistance elements located at the semiconductor region, each of the resistance elements including a first conductive film formed on the first insulating film, a second insulating film formed on the first conductive film and a second conductive film formed on the second insulating film;
a pair of first contact plugs formed on one of the resistance elements, the first contact plugs being arranged along a first direction relative to the semiconductor region; and
a pair of second contact plugs formed on the other of the resistance elements, the second contact plugs being arranged along the first direction,
wherein one of the resistance elements has a first width in a second direction which is perpendicular to the first direction, and the semiconductor region has a second width in the second direction, the first width being smaller than half of the second width; and
a first upper surface of the element isolation region is flush with a second upper surface of the first conductive film.

* * * * *